(12) United States Patent
Koelmel et al.

(10) Patent No.: US 9,245,786 B2
(45) Date of Patent: Jan. 26, 2016

(54) APPARATUS AND METHODS FOR POSITIONING A SUBSTRATE USING CAPACITIVE SENSORS

(75) Inventors: Blake Koelmel, Mountain View, CA (US); Joseph M. Ranish, San Jose, CA (US); Errol C. Sanchez, Tracy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 598 days.

(21) Appl. No.: 13/152,154

(22) Filed: Jun. 2, 2011

(65) Prior Publication Data

US 2012/0304928 A1 Dec. 6, 2012

(51) Int. Cl.
*C23C 16/458* (2006.01)
*C23C 16/52* (2006.01)
*H01L 21/68* (2006.01)
*H01L 21/67* (2006.01)

(52) U.S. Cl.
CPC .......... *H01L 21/68* (2013.01); *H01L 21/67115* (2013.01); *H01L 21/67259* (2013.01)

(58) Field of Classification Search
None
See application file for complete search history.

(56) References Cited

U.S. PATENT DOCUMENTS

| | | | |
|---|---|---|---|
| 4,457,664 A * | 7/1984 | Judell et al. | 414/779 |
| 4,568,873 A | 2/1986 | Oyanagi et al. | |
| 4,804,905 A * | 2/1989 | Ding et al. | 324/662 |
| 5,266,903 A | 11/1993 | Foster | |
| 5,942,889 A | 8/1999 | Loewenhardt et al. | |
| 6,200,634 B1 * | 3/2001 | Johnsgard et al. | 427/248.1 |
| 6,478,578 B2 | 11/2002 | Choi et al. | |
| 7,629,798 B2 | 12/2009 | Mallory et al. | |
| 2002/0078889 A1 * | 6/2002 | Welch et al. | 118/668 |
| 2003/0183611 A1 * | 10/2003 | Gregor et al. | 219/390 |
| 2003/0192866 A1 * | 10/2003 | Han | 219/121.69 |
| 2004/0068347 A1 * | 4/2004 | Aalund et al. | 700/245 |
| 2008/0280453 A1 * | 11/2008 | Koelmel et al. | 438/758 |

FOREIGN PATENT DOCUMENTS

| | | | |
|---|---|---|---|
| KR | 2010-0050951 A | | 5/2010 |
| WO | WO-9744816 A1 | | 11/1997 |

OTHER PUBLICATIONS

International Search Report and Written Opinion for Application No. PCT/US2012/037311, dated Nov. 28, 2012.

* cited by examiner

*Primary Examiner* — Charles Capozzi
(74) *Attorney, Agent, or Firm* — Patterson & Sheridan, LLP

(57) ABSTRACT

Embodiments of the present invention provide apparatus and methods for positioning a substrate in a processing chamber using capacitive sensors. One embodiment of the present invention provides an apparatus for processing a substrate. The apparatus includes first and second capacitive sensors disposed in an inner volume. The first capacitive sensor is positioned to detect a location of an edge of the substrate at a first angular location. The second capacitive sensor is positioned to detect a vertical position of the substrate.

17 Claims, 9 Drawing Sheets

APPARATUS AND METHODS FOR POSITIONING A SUBSTRATE USING CAPACITIVE SENSORS

BACKGROUND OF THE INVENTION

1. Field of the Invention

Embodiments of the present invention generally relate to apparatus and methods for processing a substrate. More particularly, embodiments of the present invention provide apparatus and methods for positioning a substrate in a processing chamber using capacitive sensors.

2. Description of the Related Art

During semiconductor processing, non-contact measurement methods are usually used to detect and control the position of the substrate being processed because the stringent requirements for cleanness and sensitivity to particle contamination. Optical sensors are typically used in non-contact substrate position detection and control.

However, optical sensors cannot be placed inside the process chamber due to the materials used to construct the optical sensors. Therefore, optical sensors typically detect the position of a substrate in a processing chamber through optical windows formed through chamber walls. The optical windows cloud up due to deposition of processing gases inside the processing chamber causing measurement of the optical sensors to drift and lose accuracy absent frequent cleaning of the optical windows.

Optical sensors for detecting a substrate location are generally positioned above and/or below the substrate. One or more processing related chamber components, for example a pedestal, a showerhead, heating lamps, or a substrate susceptor, are generally positioned above or below a substrate being processed. Thus, it is also challenging to find a location to place an optical window in a processing chamber.

Therefore, there is a need for improved non-contact measurement apparatus and methods for detect and control substrate position in a processing chamber.

SUMMARY

Embodiments of the present invention generally provide apparatus and methods for processing a substrate. More particularly, embodiments of the present invention provide apparatus and methods for positioning a substrate in a processing chamber using capacitive sensors.

One embodiment of the present invention provides an apparatus for processing a substrate. The apparatus includes a chamber body defining an inner volume, a substrate positioning assembly disposed in the inner volume, and first and second capacitive sensors disposed in the inner volume. The substrate positioning assembly is capable of moving a substrate at least within a horizontal plane. The first capacitive sensor is positioned to detect a location of an edge of the substrate at a first angular location. The second capacitive sensor is positioned to detect a vertical position of the substrate.

Another embodiment of the present invention provides an apparatus for processing a substrate. The apparatus includes a chamber body defining an inner volume and a substrate positioning assembly comprising a body having an upper surface and a plurality of ports formed on the upper surface configured to deliver a plurality of fluid flows to position a substrate over the upper surface. The apparatus further includes first, second and third capacitive sensors disposed on the upper surface of the body. The first and third capacitive sensors are disposed at two locations along a circle. The two locations are about 90 degrees apart. The second capacitive sensor is disposed in a region inside the circle. The first and third capacitive sensors are configured to measure a planar position of the substrate. The second capacitive sensor is configured measure a vertical position of the substrate.

Yet another embodiment of the present invention provides a method for positioning a substrate in a processing chamber. The method includes supporting a substrate by a substrate positioning assembly disposed in an inner volume of the processing chamber. The processing chamber includes a first capacitive sensor disposed in the inner volume and a second capacitive sensor disposed in the inner volume. A sensing surface of the first capacitive sensor is directed to an edge of the substrate at a first angular location. A sensing area of the second capacitive sensor is directed to a middle region of the substrate. The method further includes determining a vertical position of the substrate using a measurement from the second capacitive sensor, and determining a position of the edge of the substrate at the first angular location from a measurement of the first capacitive sensor and the vertical position of the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to a method and apparatus for processing a substrate. Particularly embodiments of the present invention provide apparatus and methods for positioning a substrate in a processing chamber using capacitive sensors.

Figure 1A:
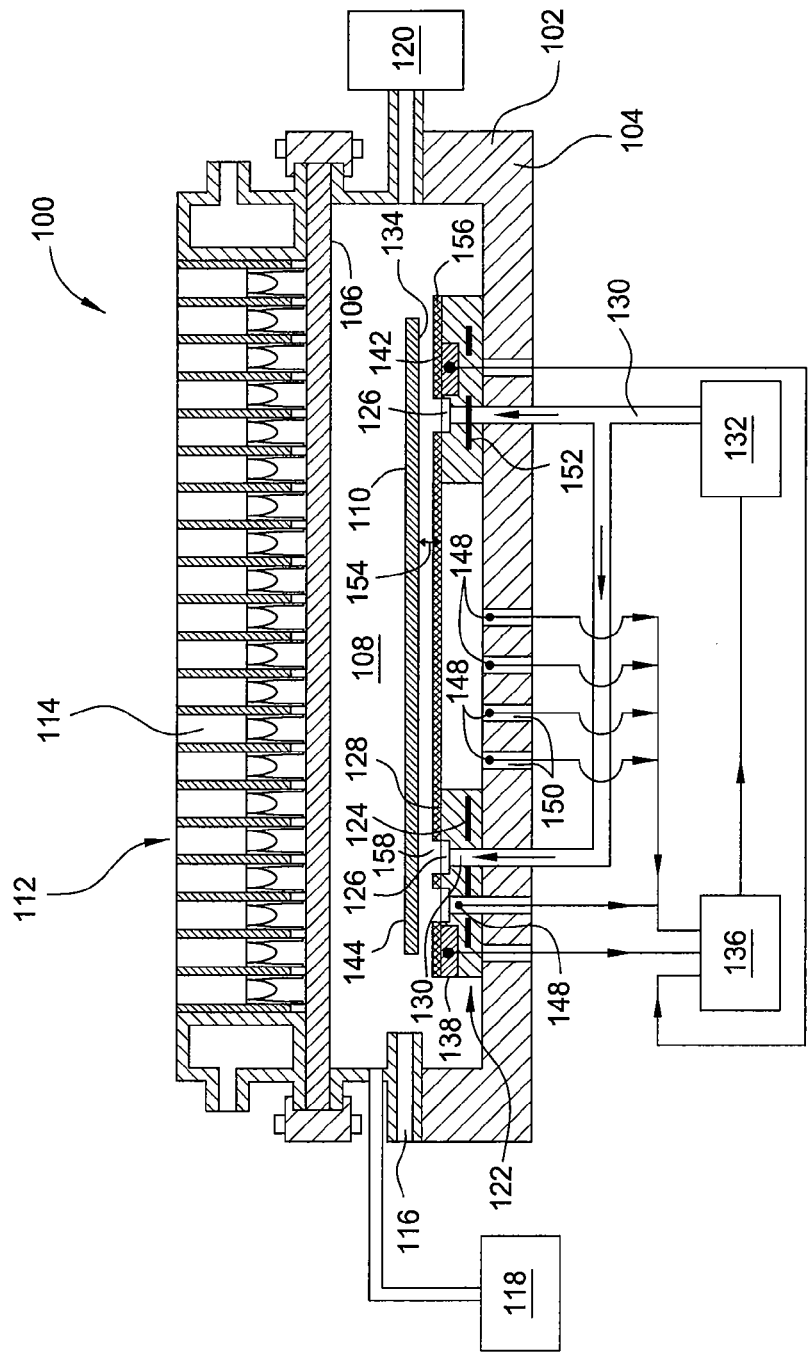
FIG. 1A is a schematic sectional side view of a processing chamber according to one embodiment of the present invention.

FIG. 1A is a schematic sectional side view of a processing chamber 100 according to one embodiment of the present invention. The processing chamber 100 is configured to perform a rapid thermal processing to a substrate while floating the substrate using a fluid delivered from ports formed in a substrate positioning assembly. The processing chamber 100 includes one or more capacitive sensors for detecting and controlling the position of the substrate.

The processing chamber 100 includes sidewalls 102, a chamber bottom 104 coupled to the sidewalls 102, and a quartz window 106 disposed over the sidewalls 102. The sidewalls 102, the chamber bottom 104 and the quartz windows 106 define an inner volume 108 for processing a substrate 110 therein. A heating assembly 112 is disposed above the quartz window 106 and configured to direct thermal energy towards the inner volume 108 through the quartz window 106. The heat assembly 112 includes a plurality of heating elements 114. In one embodiment, the plurality of heating elements 114 are a plurality of lamps.

A slit valve door 116 may be formed through the sidewalls 102 for transferring a substrate therethrough. The processing chamber 100 is coupled to a gas source 118 configured to provide one or more processing gases to the inner volume 108 during processing. A vacuum pump 120 may be coupled to the processing chamber 100 for pumping out the inner volume 108.

Figure 1B:
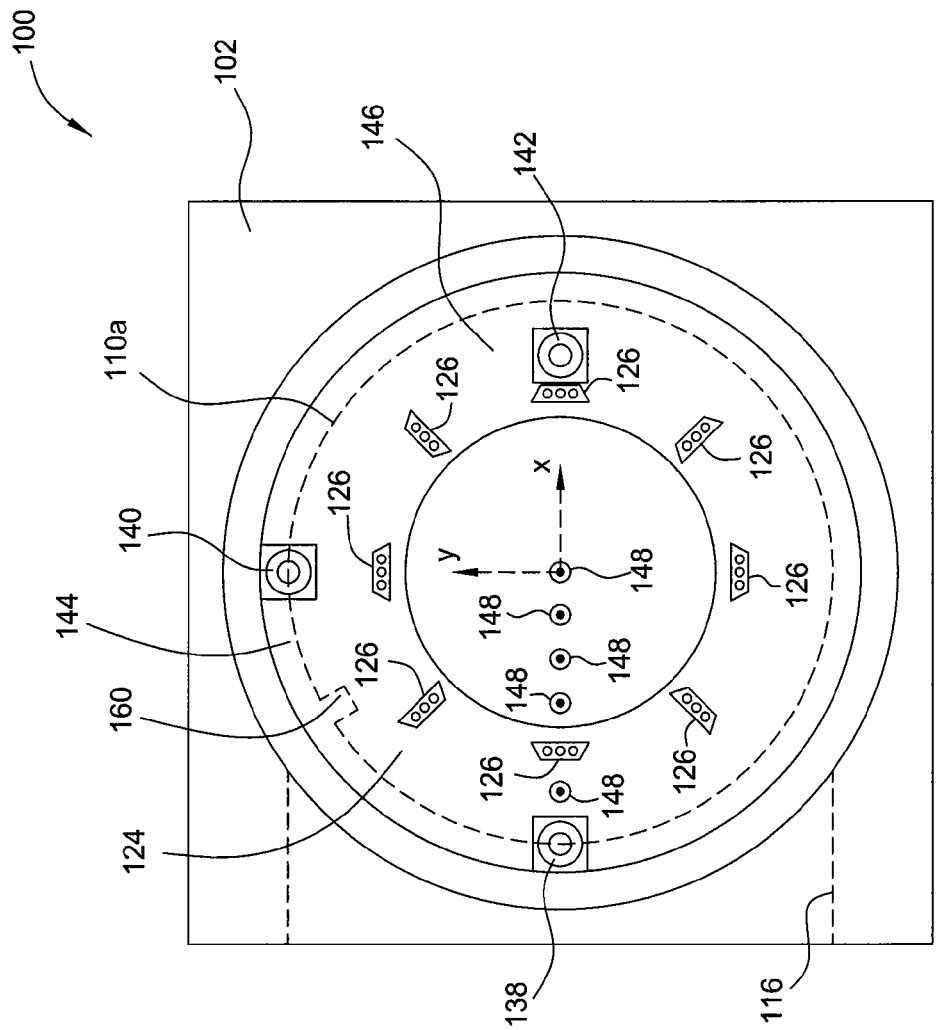
FIG. 1B is a schematic top view of the processing chamber of FIG. 1A with a lamp assembly removed.

FIG. 1B is a schematic top view of the processing chamber 100 of FIG. 1A with the heating assembly 112 removed.

A substrate positioning assembly 122 is disposed in the inner volume 108 and configured to support, position, and/or rotate the substrate 110 during processing. Particularly, the substrate positioning assembly 122 is a non-contact substrate supporting device using flows of fluid to support, position and/or rotate the substrate 110.

In one embodiment, the substrate positioning assembly 122 includes a body 124 disposed over the chamber bottom 104. A plurality of ports 126 are formed on an upper surface 128 of the body 124. FIG. 1B illustrates an exemplary arrangement of the plurality of ports 126 according to one embodiment of the present invention.

The plurality of ports 126 are connected to a fluid delivery system 132 through a plurality of channels 130 formed in the body 124. In one embodiment, the fluid delivery system 132 is configured to deliver one or more gases, such as nitrogen, helium, argon, krypton, neon, hydrogen, or combinations thereof. Alternatively, the fluid delivery system 132 may be configured to deliver a liquid flow, such as water.

The upper surface 128 of the body 124 may be heated. In one embodiment, the upper surface 128 may be heated by heating the fluid delivered to the plurality of ports 126. In alternative embodiments, one or more heaters 152 may be embedded in the body 124 to heat the upper surface 128.

The plurality of ports 126 are configured to direct a plurality of fluid flows towards a lower surface 134 of the substrate 110 to support and move the substrate 110 using friction generated and momentum transferred when the fluid flows strike the lower surface 134 of the substrate 110. The substrate 110 is supported, positioned, and/or rotated by controlling the characteristics of the fluid flows delivered from the plurality of ports 126, such as the rates and directions of the plurality of fluid flows. The force imparted by each fluid flow can be combined to cause the substrate 110 to be moved and be positioned as needed.

Detailed description of an exemplary substrate positioning assembly using fluid flow may be found in United States Patent Publication No. 2008/0280453, entitled "Apparatus and Method for Supporting, Positioning and Rotating a Substrate in a Processing Chamber".

The processing chamber 100 may include a plurality of thermal sensors 148 configured to measure temperatures of the substrate 110 at various locations. The plurality of thermal sensors 148 may be disposed in openings 150 formed through the chamber bottom 104.

The processing chamber 100 also includes two or more sensors 138, 140, 142 configured to detecting the position of the substrate 110 in the processing chamber 100. FIGS. 1A-1B show three sensors 138, 140, 142 disposed in the processing chamber 100. However, other arrangement of sensors may be used. The sensors 138, 140, 142 are connected to a controller 136. The controller 136 is further connected to the fluid delivery system 132. The sensors 138, 140, 142, the controller 136 and the fluid delivery system 132 form a closed loop control system to control the position of the substrate 110. The controller 136 determines the position and status of the substrate 110, such as height, horizontal location, rotation rate, according to measurements from the sensors 138, 140, 142. The controller 136 then sends control signals to the fluid delivery system 132 to adjust the characteristics of the fluid flows from the plurality of ports 126 to adjust the position and/or status of the substrate 110 to reach/maintain a target position/status. For example, during a rapid thermal processing, a target position of the substrate 110 may be set such that the substrate 110 can be evenly heated by the heating assembly 112 during processing.

In one embodiment, each of the two or more sensors 138, 140, 142 is a capacitive sensor directed towards a portion of the substrate 110 while the substrate 110 is approximate a processing position. Each sensor 138, 140, 142 is configured to detect the relative location of the perspective portion of the substrate 110.

In one embodiment, the sensors 138 and 140 are configured to detect horizontal positions of a periphery edge of the substrate 110 along the x-axis and y-axis respectively, and the sensor 142 is configured to detect a vertical location of the substrate 110. The sensors 138 and 140 are directed to an edge of the substrate 110 when the substrate 110 is in a target position 110a shown in a dotted circle in FIG. 1B so that the sensors 138 and 140 can detect the distance between of the periphery edge of the substrate 110 and the target position 110a. In one embodiment, the sensors 138 and 140 are positioned at two locations along a circle that is substantially the same size as the substrate 110. The sensor 142 is directed to a middle region of the substrate 110 when the substrate 110 is in the target position 110a.

In one embodiment, the two or more sensors 138, 140, 142 are disposed in the same horizontal plane. For example, the two or more sensors 138, 140, 142 sensors are positioned in the upper surface 128 of the body 124. The sensors 138, 140 are mounted on the body 124 along an edge 144. The sensors 138, 140 may be disposed along the edge 144 at about 90 degrees apart so that the sensor 138 can detect the position of the substrate 110 along the x-axis and the sensor 140 can detect the position of the substrate 110 along the y-axis.

In one embodiment, each of the sensors 138 and 140 is capable of detecting a notch 160 formed on the edge of the substrate 110. As a result, when the substrate 110 is rotating, the rotation speed of the substrate 110 can be determined from the frequency of the signals indicating the notch 160 detected by either one of the sensors 138, 140. Furthermore, the rotation direction of the substrate 110 can be determined using the signals indicating the notch 160 from both of the sensors 138, 140 together.

The sensor 142 is mounted on the body 124 in a middle portion 146 so that the measurement of the sensor 142 is not affected by the edge of the substrate 110 when the substrate 110 is approximate to the target position 110a. The sensor 142 may be used to determine the height or vertical location of the substrate 110. The sensor 142 may also be used to increase the accuracy of *the* measurements from the sensors 138, 140 directed to the edge of the substrate 110 as discussed below with FIGS. 2A-2F.

The processing chamber 100 may have only one sensor. For example, the processing chamber may have only a sensor, such as the sensor 142, disposed and/or adapted to detect a vertical or z-axis location of a substrate. The processing chamber 100 may likewise have only a sensor, such as either of the sensors 138 and 140, disposed and/or adapted to detect a horizontal location, an x-axis location, or a y-axis location of the substrate. As such, the processing chamber 100 may have one or more sensors adapted and/or disposed to detect the substrate location.

The processing chamber 100 may include an optional window 156 disposed on the upper surface 128 covering one or more of the sensors 138, 140, 142 to prevent any material deposition on the sensors. The window 156, which may be quartz, may have openings 158 to accommodate fluid flow from the portals 126. The window 156, which may be a deposition shield, may be transparent to temperature indicative radiation that may be emitted by the substrate 144 and sensed by the temperature sensors 148. Alternately, the window 156 may have openings to allow direct viewing of the substrate 144 by the temperature sensors 148. As such, the window 156 may partially cover the upper surface 128, for example covering only a peripheral portion of the upper surface 128. The window 156 may be replaced as needed if deposited material reduces transparency.

FIGS. 2A-2F schematically illustrate methods for using a capacitive sensor 202 to detect a location of a substrate according to embodiments of the present invention. The capacitive sensor 202 may be placed in the processing chamber 100 as any one of the sensors 138, 140, 142.

The capacitive sensor 202 includes a sensor electrode 208, a guard electrode 204 surrounding the sensor electrode 208, and an insulator element 206 electrically separating the sensor electrode 208 from the guard electrode 204. Leads 210 and 212 are coupled to the guard electrode 204 and the sensor electrode 208 respectively. A sensing surface 218 of the sensor electrode 208 is exposed and configured to face a subject being measured, such as the substrate 216. The capacitive sensor 202 is configured to determine one or more characteristics of an object positioned in a sensing area 228 projected from the sensing surface 218. In one embodiment, the sensing surface 218 is circular and planar, the sensor electrode 208 and the guard electrode 204 are concentrically arranged, and the sensing area 228 is defined in a cone shaped volume.

During operation, an electrical voltage is applied to the guard electrode 204 via the lead 210. The electromagnetic field 214 of the charged guard electrode 204 travels from the guard electrode 204 to the sensing surface 218 of the sensor electrode 208. As a result, a voltage can be detected on the sensor electrode 208 through the lead 212. The sensing surface 218 is directed to an object being measured or an object being measured is positioned within the sensing area 228. The distance and location of the object being measured would affect the voltage on the sensor electrode 208.

Furthermore, the capacitive sensor 202 may be used to measure other characteristics of the substrate, such as the mass of the substrate, thickness of the substrate, or a thickness of a film deposited on the substrate. For example, the capacitive sensor 202 may be used to measure a distance from the capacitive sensor to an upper surface of the substrate while a bottom of the substrate is disposed in a fixed plane at a known distance. The difference between the measured distance and the known distance indicates the thickness of the substrate.

Figure 2A:
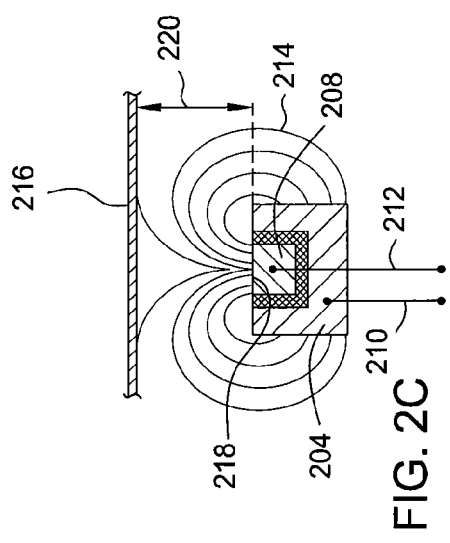
FIGS. 2A-2F schematically illustrate methods for using a capacitive sensor to detect a location of a substrate according to embodiments of the present invention.
Figure 2C:
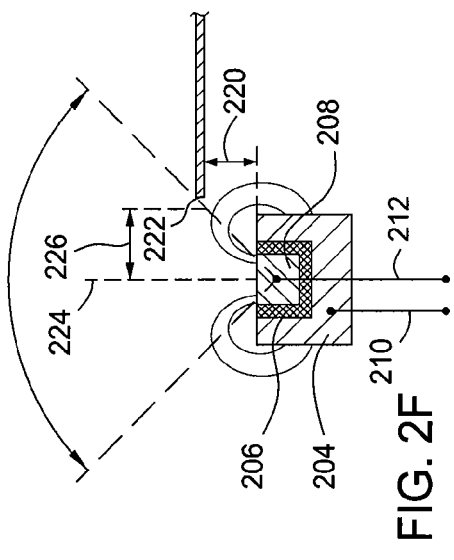
Figure 2B:
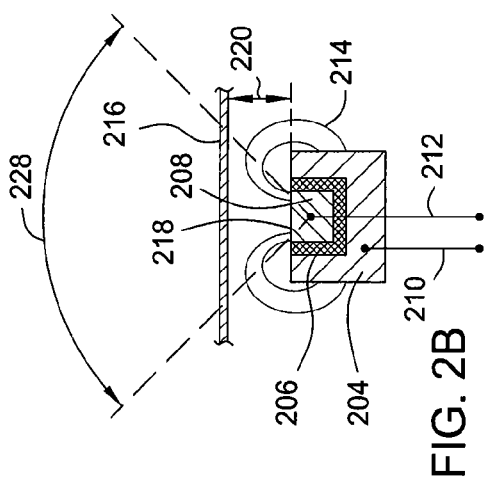

In one embodiment of the present invention, the capacitive sensor 202 is used to measure a distance between the substrate 216 and the capacitive sensor 202 itself. As shown in FIGS. 2B and 2C, the capacitive sensor 202 used in measuring a distance 220 between the substrate 216 and the sensing surface 218 of the capacitive sensor 202. In one embodiment, during measurement, the sensing surface 218 is directed to a middle portion of the substrate 216 and the capacitive sensor 202 is positioned such that the sensing surface 218 is substantially parallel to the substrate 216. Because the sensing surface 218 is directed at a middle portion of the substrate 216, the substrate 216 covers the entire sensing area 228 of the capacitive sensor 202. When the same voltage is applied to the guard electrode 204, the voltage of the sensor electrode 208 changes with the change in the distance 220 because the substrate 216 interferes with the electromagnetic field 214 changing the capacitance between the sensor electrode 208 and the guard electrode 204. For example, the sensor 142 of FIG. 1B is disposed in a location for measuring a distance of a substrate from the sensor 142 as shown in FIGS. 2B-2C.

Figure 2E:
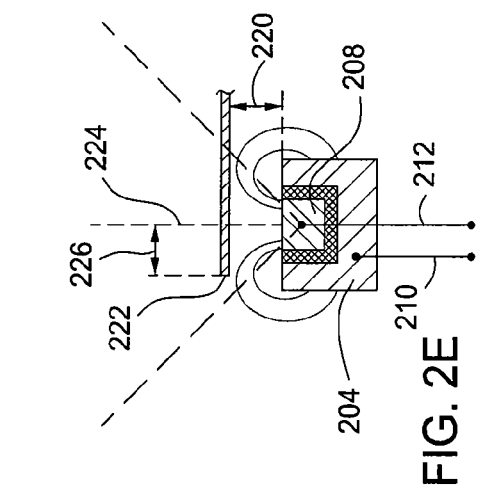
Figure 2D:
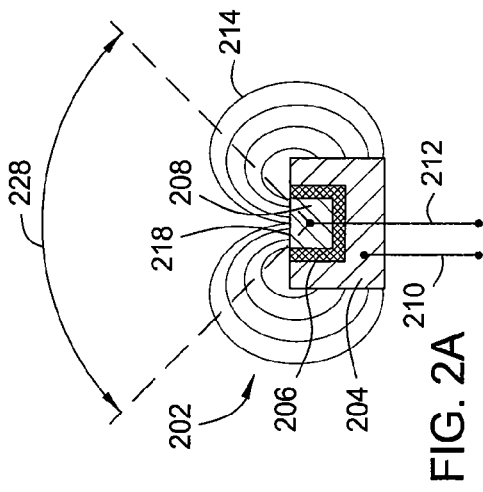
Figure 2F:
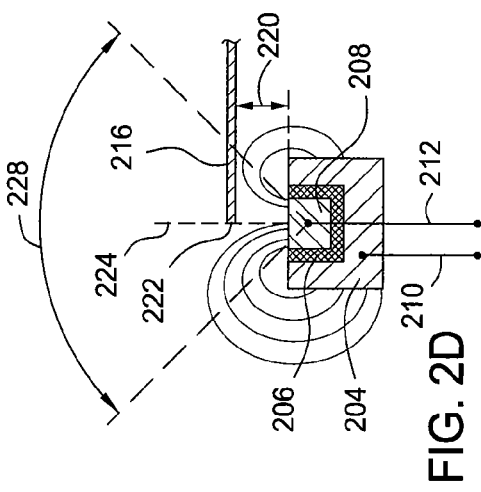

In another embodiment of the present invention, the capacitive sensor 202 is used to determine a location of an edge 222 of the substrate 216 by positioning the capacitor sensor 202 so that the edge 222 of the substrate 216 is within the sensing area 228 of the capacitive sensor 202. As shown in FIGS. 2D-2F, the substrate 216 covers the sensing area 228 at different degrees when the edge 222 is located at different locations. A central axis 224 of the capacitive sensor 202 can be used as a reference to describe the location of the edge 222. In FIG. 2D, the edge 222 is aligned with the central axis 224 and the distance 226 is zero. In FIG. 2E, the edge 222 passes the central axis 224 and the distance 226 is a negative value. In FIG. 2F, the edge 222 is away from the central axis 224 and the distance 226 is a positive value. The size of overlapping area between the substrate 216 and the sensing area 228 corresponds to the value of the distance 226. When the distance 220 and the voltage level applied to the guard electrode 204 remain consistent, the voltage of the sensor electrode 208 corresponds to the size of overlapping area between the substrate 216 and the sensing area 228 and the distance 226. Accordingly, in one embodiment of the present invention, the voltage level of the sensing electrode 204 is used determine the distance 226 when the distance 220 and the voltage level applied to the guard electrode 204 remain consistent.

According to embodiments of the present invention, two or more capacitive sensor may be used in combination to measure a characteristics of a substrate.

In one embodiment, while measuring the location of the edge 222 of the substrate 216, an additional capacitive sensor 202 may be positioned to measure the distance 220. The distance 220 may be used to calibrate the capacitive sensor 202 measuring the location of the edge 222 since the distance 220 affects the voltage level of sensor electrode 208 of the capacitive sensor 202 measuring the location of the edge 222. For example, the sensor 142 of FIGS. 1A-1B can be used to calibrate the sensors 138 and 140.

In another embodiment, two capacitive sensors may be positioned to have their sensing areas aligned with two points on the edge of a substrate to determine the location of the substrate with in a plane. The two capacitive sensors may be directed at two points an angle close to 90 degrees along the edge of the substrate. The two capacitive sensors may be used to determine a location of the substrate 216 in a plane parallel to the sensing surface 218. For example, the sensors 138, 140 of FIG. 1B can be used together to obtain a position of the substrate in two coordinates.

Figure 3:
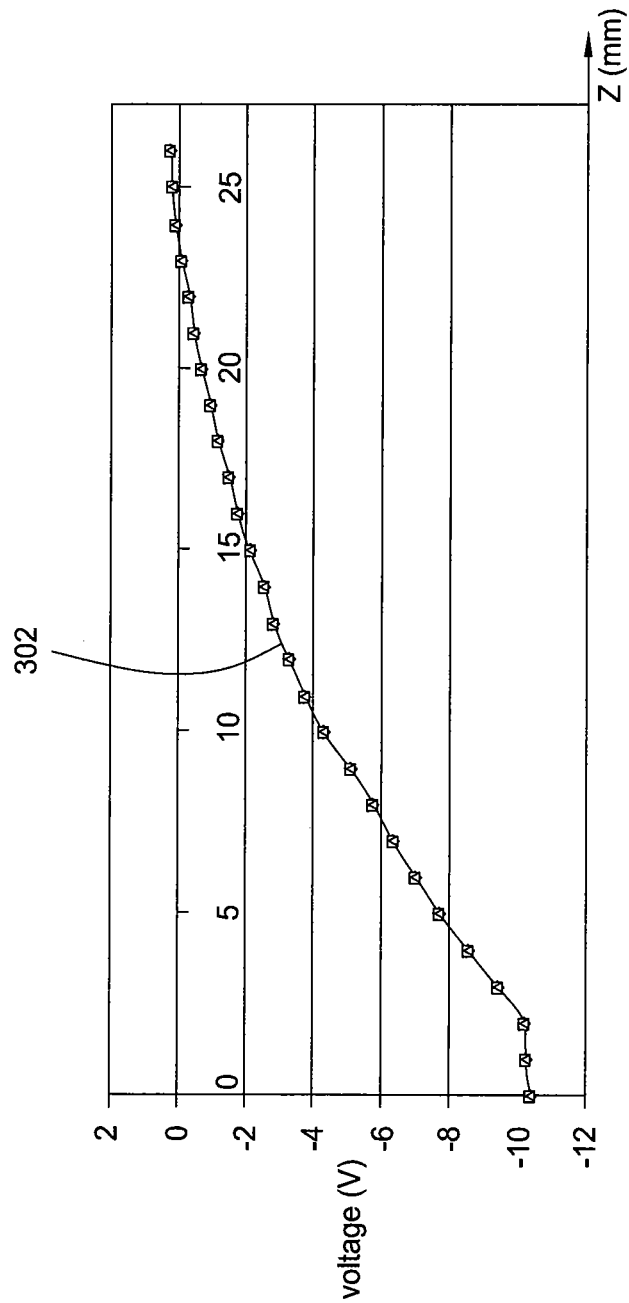
FIG. 3 is an exemplary graph showing a relationship between a capacitive sensor signal and a distance between the capacitive sensor and a substrate while the capacitive sensor is directed towards a middle region of the substrate according to one embodiment of the present invention.

FIG. 3 is an exemplary graph showing a relationship between a capacitive sensor signal and a distance between the capacitive sensor and a substrate while the capacitive sensor is directed towards a middle region of the substrate as illustrated in FIGS. 2B-2C. In FIG. 3, the x-axis indicates a vertical distance z in millimeter between a sensing surface of a capacitive sensor, such as the capacitive sensor 202, and a substrate disposed above the capacitive sensor. The y-axis indicates a measured voltage in Volt of the sensor electrode of the capacitive sensor. The curve 302 reflects the measured voltage from a capacitive sensor when the substrate is located at various vertical distances. As shown by the curve 302, the measured voltage changes gradually with the vertical distance in a range of over about 20 millimeter. Accordingly, embodiments of the present invention may have a measuring range of at least about 20 millimeter.

Figure 4:
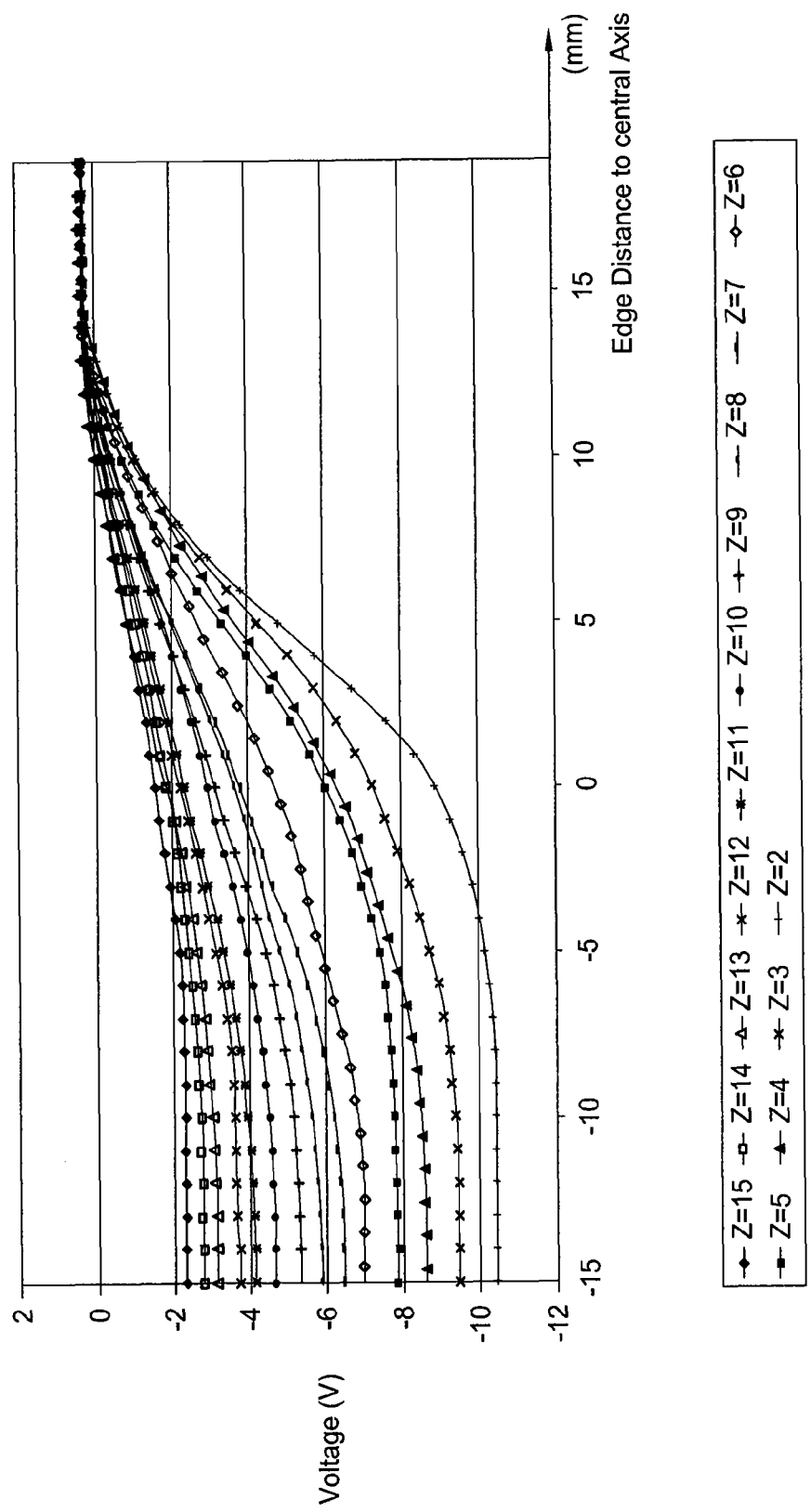
FIG. 4 is an exemplary graph showing relationships between a capacitive sensor signal and a distance between an edge of a substrate and a central axis of the capacitive sensor according to one embodiment of the present invention.

FIG. 4 is an exemplary graph showing relationships between a capacitive sensor signal and a distance between an edge of a substrate and a central axis of the capacitive sensor as illustrated in FIGS. 2D-2F. In FIG. 4, the x-axis indicates an edge distance in millimeter between an edge of the substrate and a central axis of a capacitive sensor, such as the capacitive sensor 202 in FIGS. 2D-2F. The y-axis indicates a measured voltage in Volt of the sensor electrode of the capacitive sensor. Each curve in FIG. 4 reflects the measured voltage from a capacitive sensor when the edge of the substrate located at various locations within a plane at a fixed distance z away from capacitive sensor. As shown in FIG. 4, the location of the edge of the substrate can be determined from the measured voltage when the distance z is known.

Referring back to FIGS. 1A-1B, the processing chamber 100 includes at least one capacitive sensor 142 located beneath the substrate 110 such that the entire sensing area of the capacitive sensor 142 is covered by the substrate 110 at all times, therefore, enabling the capacitive sensor 142 to measure a fly height 154 (Z direction) of the substrate 110 while the substrate is floating. Alternatively, the capacitive sensor 142 may be positioned above the substrate 110, for example, on the quartz window 106.

The processing chamber 100 includes at least two other capacitive sensors 138, 140 placed on the substrate positioning assembly 122 at the same diameter, about 90 degrees apart from one another as an "x" sensor and a "y" sensor. The capacitive sensors 138, 140 measure the nominal location of the edge 144 of the substrate 110 relative to the centers of the capacitive sensors 138, 140. For example, as shown in FIG. 1B, when the substrate 110 moves in the −x direction (to the left), the sensing area of the capacitive sensor 138 will "see" more of the substrate 110 and thus the capacitance (voltage differential) of the capacitive sensor 138 increases. Since the edge movement in both the x and vertical directions can change the capacitance of the capacitive sensor 138, position of the substrate 110 along the x direction can be precisely obtained by subtracting any capacitance changes in the measurement of the capacitive sensor caused by the substrate 110s movement along the vertical direction.

Accordingly, with as few as three capacitive sensors, the fly height 154 and positions along the x and y directions of the substrate 110 can be obtained according to embodiments of the present invention. Capacitive sensors according to embodiment of the present invention are capable of withstanding vacuum environments and temperatures of at least about 400° C., or greater than about 400° C., for example up to about 1000° C. In one embodiment, the capacitive sensors 138, 140, 142, 202 are manufactured from materials that can withstand vacuum environments and high temperature. In one embodiment, the capacitive sensors 138, 140, 142, 202 are manufactured from alumina and INCONEL® alloy. In another embodiment, the capacitive sensors 138, 140, 142, 202 are manufactured from alumina and HAYNES® 230® alloy. Exemplary capacitive sensors suitable for the sensors 138, 140, 142, 202 may be capacitive sensors manufactured by Capacitec, Inc.

Figure 5:
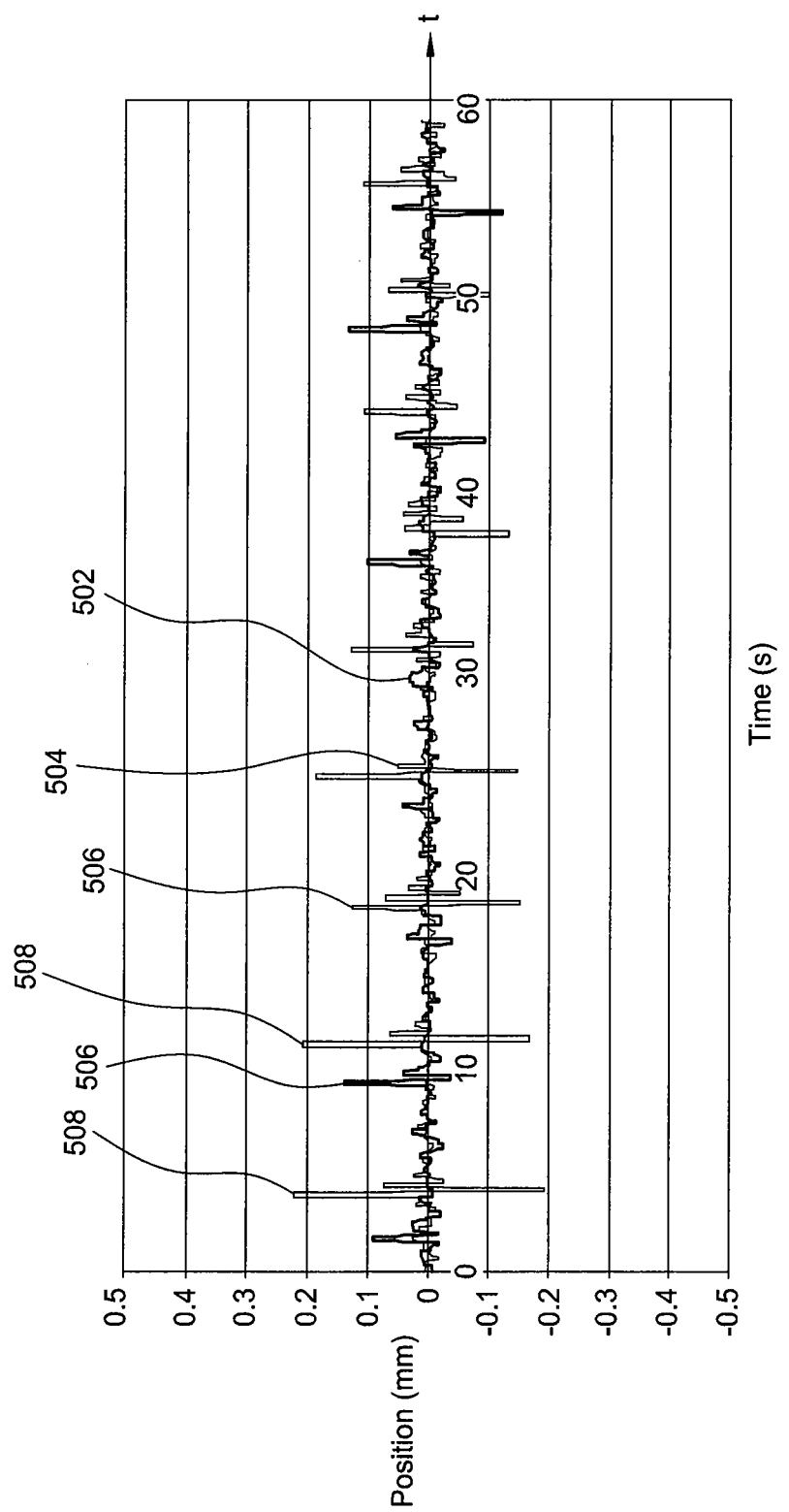
FIG. 5 is an exemplary graph showing measurements of a substrate location along X and Y directions according to one embodiment of the present invention.

FIG. 5 is an exemplary graph showing measurements of locations of the substrate 110 along the x and y directions while floating and rotating in the processing chamber 100 of FIGS. 1A-1B. In FIG. 5, the x-axis indicates time in seconds, and the y-axis indicates an edge distance in millimeter between an edge of the substrate and a central axis of the capacitive sensor 138 or 140. Curve 502 indicates edge positions of the substrate 110 along the x direction obtained from the measurement of the sensor 138 and curve 504 indicates edge positions of the substrate 110 along the y direction obtained from the measurement of the sensor 140. Peaks 506 and 508 in the curves 502, 504 are measurement obtained when the notch 160 passes the sensors 138, 140. In one embodiment, a rotational rate of the substrate 110 may be obtained from the frequency of the peaks 506 or 508. In another embodiment, the rotational direction of the substrate 110 may be obtained from the sequence of the peaks 506, 508.

After obtaining one or more characteristics, such as planar positions, rotational rate, height, of the substrate 110, the characteristics can be adjusted and controlled by the controller 136.

Figure 6:
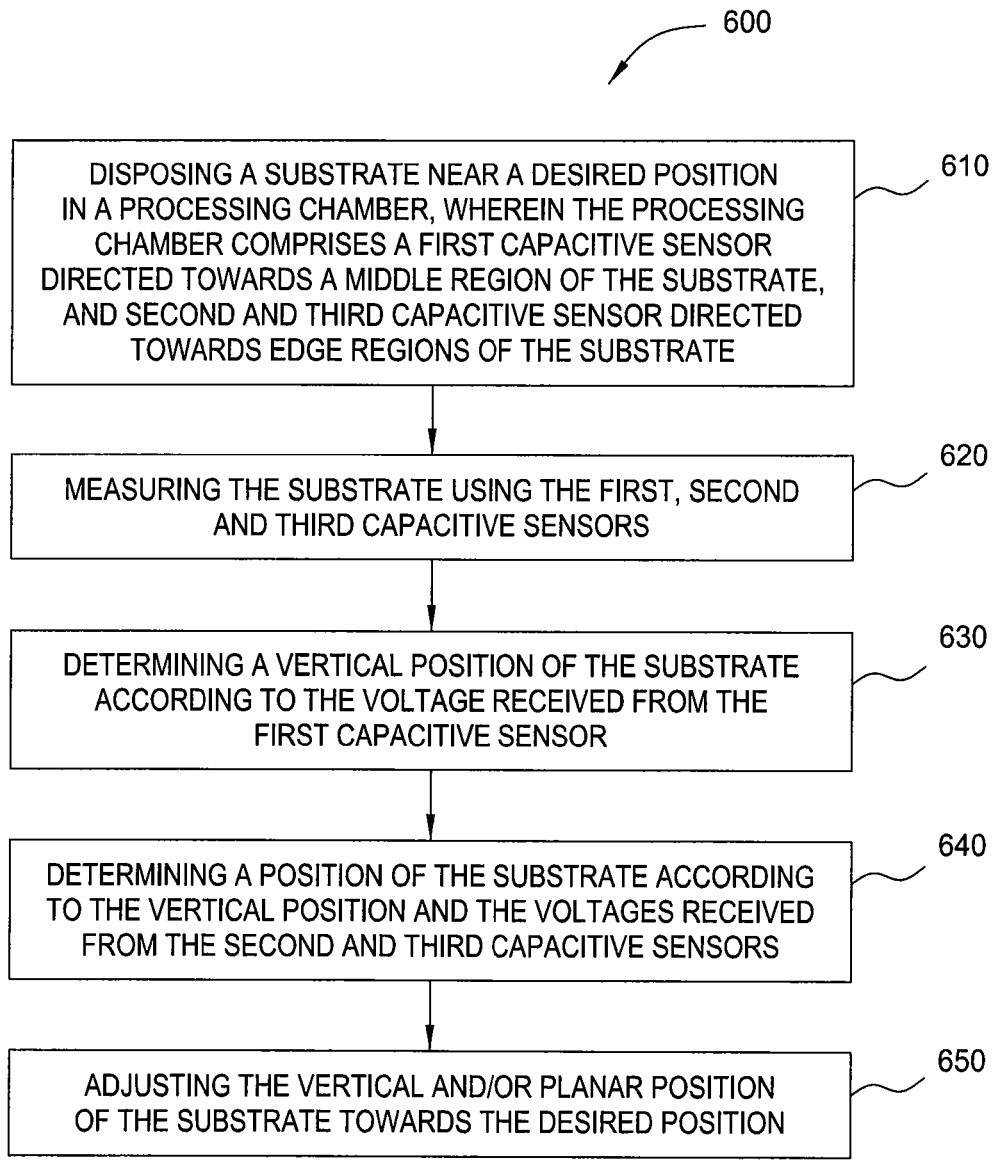
FIG. 6 is a flow chart of a method for controlling a substrate position according to one embodiment of the present invention.

FIG. 6 is a flow chart of a method 600 for controlling a substrate position according to one embodiment of the present invention. Particularly, method 600 is configured to position and maintain a substrate in a desired position using capacitive sensors according to embodiments of the present invention.

In box 610, a substrate is disposed near a desired position in a processing chamber, such as the processing chamber 100 of FIGS. 1A-1B. Disposing the substrate may include floating the substrate by providing fluid flows towards the substrate to support and/or rotate the substrate. The processing chamber may include a first capacitive sensor, such as the sensor 142, directed towards a middle region of the substrate, and second and third capacitive sensors, such as the sensors 138, 140, directed towards the edge region of the substrate.

In box 620, the substrate is measured using the first, second and third capacitive sensors in the processing chamber. In one embodiment, voltage levels of the sensing electrode of each capacitive sensor may be measured one or more times or periodically.

In box 630, a vertical position of the substrate is determined according to voltage received from the first capacitive sensor. In one embodiment, the vertical position of the substrate may be determined using a look-up table generated from a relationship between the measured voltage and the distance similar to the relationship shown in FIG. 3.

In box 640, a planar position of the substrate is determined according to the vertical position determined in box 630 and voltages received from the second and third capacitive sensors. In one embodiment, the planar position along the x and/or y direction can be determined using a look-up table generated from a relationship between height, voltage and distance similar to the relationship shown in FIG. 4.

In box 650, the substrate is moved towards to the desired position according to the determined vertical and/or planar position. Box 620, 630, 640, and 650 can be performed repeatedly until the substrate is substantially close to the desired position.

Embodiments of the present invention provide methods for measuring a characteristics of an object, such as a location, a rotational speed, an orientation, or a levelness, using one or more capacitive sensors, similar to the capacitive sensor 202. The capacitive sensor 202 may be used to measure characteristics of any object that is not transparent to electromagnetic field, for example a semiconductor substrate, a poly-silicon substrate, a nickel coated semiconductor substrate, or a substrate with device layers formed thereon. Beside controlling the position of a substrate during processing, embodiments of the present invention may be used to measure a substrate for centering, metrology, or other functions.

Figure 7:
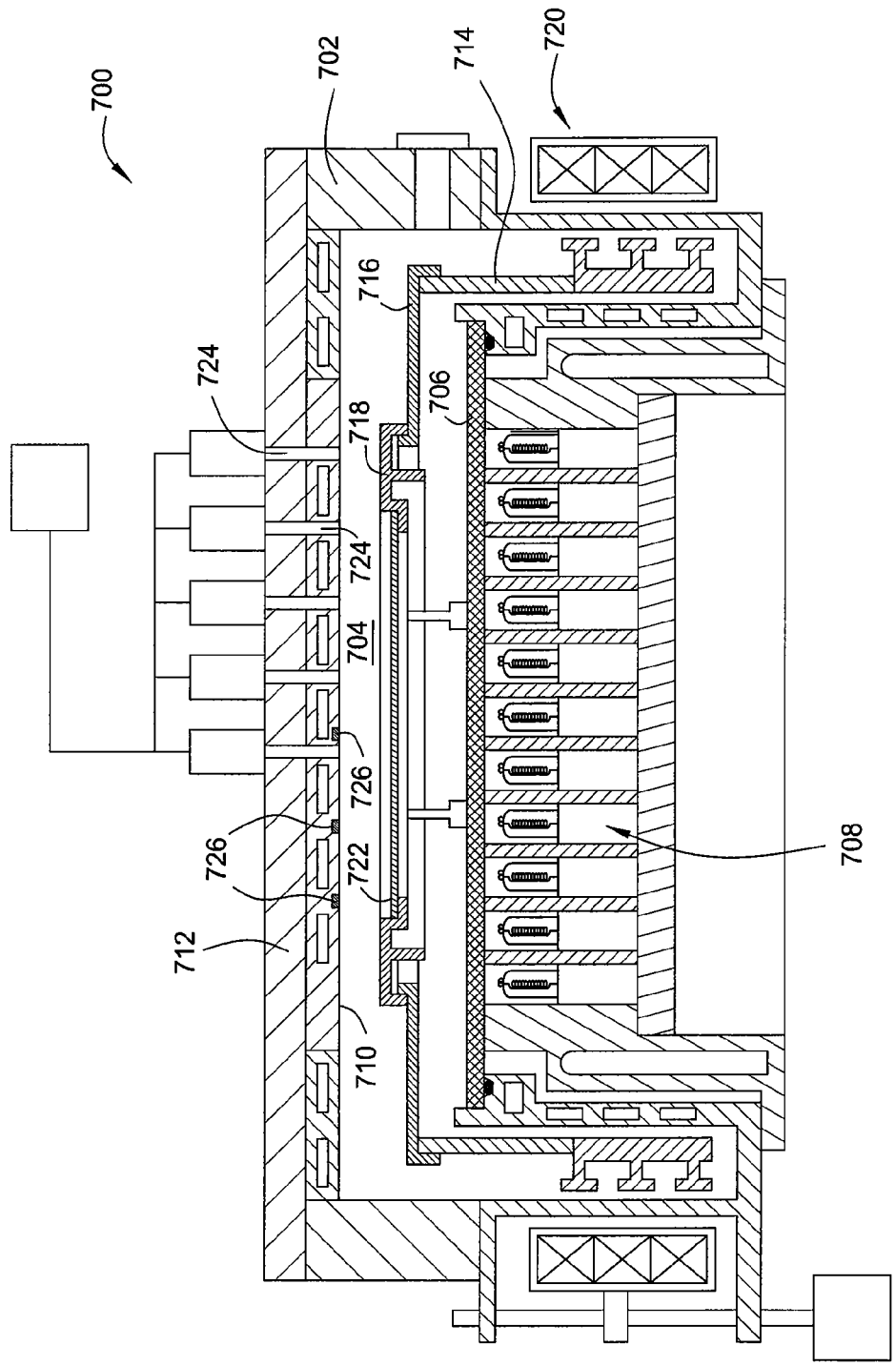
FIG. 7 is a schematic sectional view of a processing chamber having capacitive sensors for measuring and controlling levelness of a substrate being processed.

FIG. 7 is a schematic sectional view of a processing chamber 700 having capacitive sensors for measuring and controlling levelness of a substrate being processed. The processing chamber 700 is a rapid thermal processing chamber.

The processing chamber 700 includes a chamber body 702 defining a processing volume 704. A window 706 is formed on a bottom side of the chamber body 702. The window 706 may be formed from quartz. A radiant energy source 708 is disposed below the window 706. The radiant energy source 708 is configured to direct radiant energy towards the processing volume 704. A reflection plate 710 is disposed on an upper wall 712 of the chamber body 702 inside the processing volume 704. A plurality of thermal sensors 724 may be disposed through the reflection plate 710.

A raiser assembly 720 is configured to vertically move and rotate a rotor 714 disposed in the processing volume 704. A supporting ring 716 is disposed on the rotor 714. An edge ring 718 is supported by the supporting ring 716. A substrate 722 is disposed on the edge ring 718. The edge ring 718 and the substrate 722 are positioned above the radiant energy source 708 so that the radiant energy source 708 can heat both the substrate 722 and the edge ring 718.

The processing chamber 700 further includes two or more capacitive sensors 726 disposed on the reflection plate 710. The two or more capacitive sensors 726 are directed towards the substrate 722 and configured to measure a position of the substrate 722. The two or more capacitive sensors 726 may be positioned at different radial positions and measurements of the two or more capacitive sensors 726 may be used to determine the levelness substrate 722.

Figure 8:
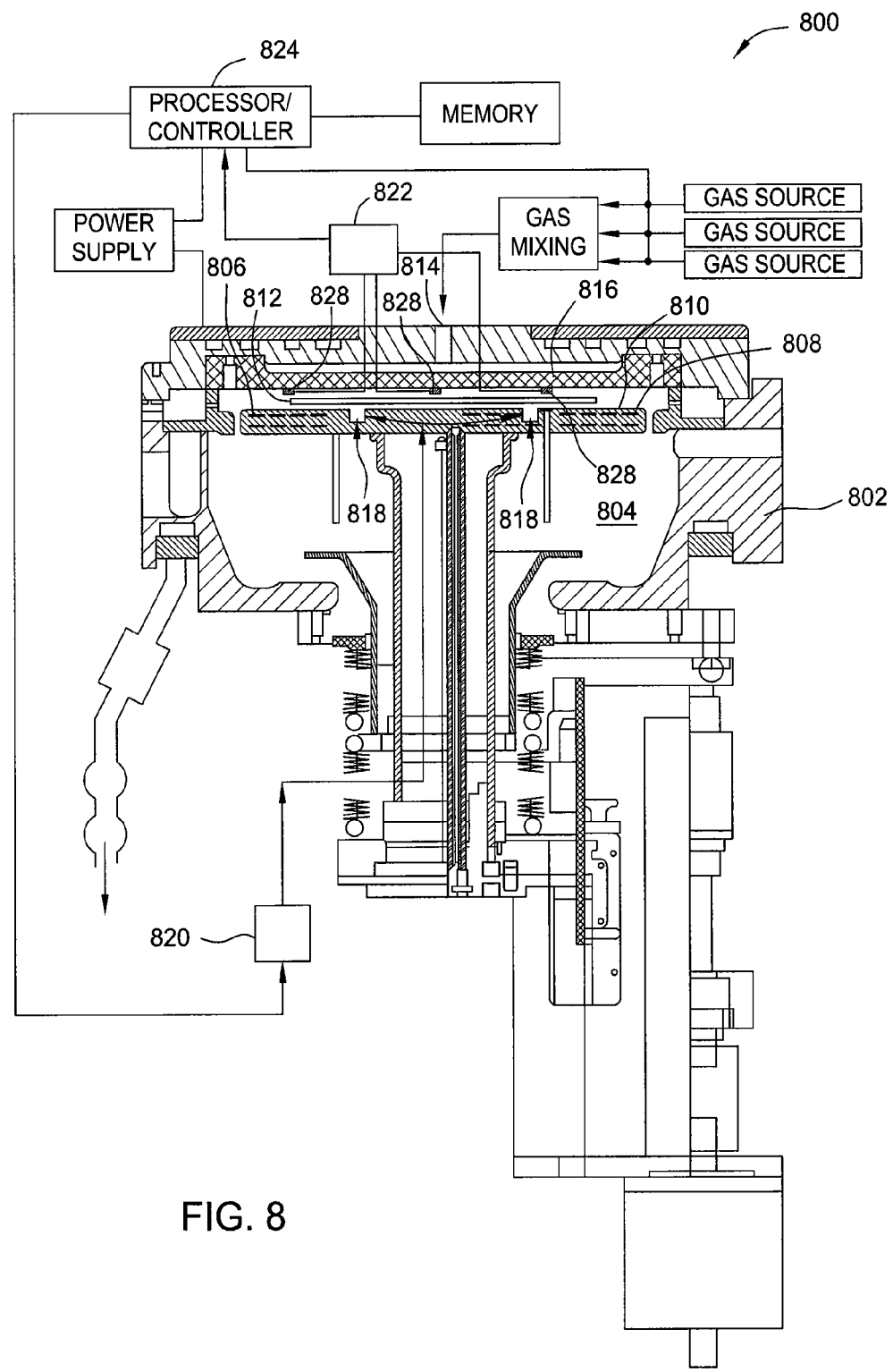
FIG. 8 is a schematic sectional view of a processing chamber having capacitive sensors according to one embodiment of the present invention.

FIG. 8 is a schematic sectional view of a chemical vapor deposition (CVD) chamber 800 having capacitive sensors according to one embodiment of the present invention.

The CVD chamber 800 includes a chamber body 802 defining a reaction volume 804. A susceptor 806 is disposed in the reaction volume 804. The susceptor 806 may contain a resistive heater 808 and a surface area 810 sufficient to support a substrate 812. The susceptor 806 is adapted to support, position, and/or rotate the substrate 812 disposed thereon. The susceptor 806 contains a plurality of ports 818 that are in communication with the fluid delivery system 820.

During processing a process gas may enter the reaction volume 804 through a gas distribution port 814 and a showerhead 816 located above the susceptor 806.

The CVD chamber 800 also includes a sensing assembly 822. The sensing assembly 822 includes two or more capacitive sensors 828 configured to detect position of the substrate 812. In one embodiment, the two more capacitive sensors 828 may be mounted on the showerhead 816. The two or more capacitive sensors 828 may be arranged in a manner similar to the capacitive sensors 138, 140, 142 in the processing chamber 100 to detect vertical location and planar positions of the substrate 812.

The fluid delivery system 820 and the sensing assembly 822 are coupled to a controller 824. The controller 824 with the fluid delivery system 820 and the sensing assembly 822 are configured to position and/or rotate the substrate 812 during processing.

Embodiments of the present invention provide apparatus and methods for monitoring one or more characteristics of a substrate in a processing chamber. Embodiments of the present invention have several advantages.

First, embodiments of the present invention are able to measure a substrate in a processing chamber during a high temperature process, such as a CVD process, a rapid thermal process. Particularly, embodiments of the present invention may be used with existing processing chambers by simply adding one or more capacitive sensors to the existing processing chamber. For example, one or more capacitive sensors may be installed in a substrate support, such as a heated pedestal, a non-contact floating susceptor. Using the one or more capacitive sensors, embodiments of the present invention may precisely control characteristics of the substrate, such as location, height, rotation rate, to improve processing uniformity.

Secondly, embodiments of the present invention using capacitive sensors inside a processing chamber, thus avoid structure complexities caused by traditional sensors, such as optical sensors. Furthermore, embodiments of the present invention avoid using windows or shields for the sensors, thus, eliminating the needs for cleaning the window or shields between processing and improving chamber efficiency.

Additionally, by incorporating capacitive sensors, embodiments of the present invention improve sensitivity and accuracy of the sensing system.

Furthermore, embodiments of the present invention may be used to measure and monitor any substrates that are not transparent to electromagnetic field.

Even though embodiments of the present invention are described with RTP chambers and PECVD chamber, embodiments of the present invention may be used in any suitable chambers wherein non-contact substrate position measurement and/or control is needed. For example, embodiments of the present invention may be used in a chemical vapor deposition chamber, an atomic layer deposition chamber, a thermal processing chamber with flash lamps, a laser anneal chamber, a physical vapor deposition chamber, an ion implantation chamber, a plasma oxidation chamber, an alignment chamber, or a load lock chamber.

While the foregoing is directed to embodiments of the present invention, other and further embodiments of the invention may be devised without departing from the basic scope thereof, and the scope thereof is determined by the claims that follow.

What is claimed is:

1. An apparatus for processing a substrate, comprising:
    a chamber body defining an inner volume;

a non-contact substrate positioning assembly disposed in the inner volume, wherein the non-contact substrate positioning assembly is capable of moving a substrate at least within a horizontal plane;

a first capacitive sensor disposed in an upper surface of the non-contact substrate positioning assembly, wherein the first capacitive sensor is positioned to measure a distance between a location of an edge of the substrate at a first angular location in the horizontal plane and a first target position at the first angular location in the horizontal plane;

a second capacitive sensor positioned in the upper surface, wherein the second capacitive sensor is positioned to measure a distance between a location of the edge of the substrate at a second angular location in the horizontal plane and a second target position at the second angular location in the horizontal plane;

a third capacitive sensor positioned in the upper surface, wherein the third capacitive sensor is positioned to measure a distance between a vertical location of the substrate and the third capacitive sensor, wherein the first, second and third capacitive sensors are configured to operate in temperatures between about 400° C. and about 1000° C.;

a plurality of ports formed through the upper surface, the plurality of ports configured to support and rotate a substrate over the upper surface by delivering fluid flows towards the substrate, wherein the first capacitive sensor is aligned with a first port of the plurality of ports along a first radius extending from a center of the upper surface of the non-contact substrate positioning assembly; and a controller coupled to the first, second, and third capacitive sensors, wherein the controller is configured to determine a vertical position of the substrate from a measurement of the third capacitive sensor, and to determine a distance of the edge of the substrate at the first angular location from the first target position by using a measurement of the first capacitive sensor and the vertical position of the substrate.

2. The apparatus of claim 1, wherein the first and second angular locations are about 90 degrees apart.

3. The apparatus of claim 1, wherein each of the first and second capacitive sensors includes a sensing surface, and the sensing surfaces are positioned in a same plane as the upper surface for the non-contact substrate positioning assembly.

4. The apparatus of claim 1, further comprising a heating assembly disposed outside the chamber body configured to direct thermal energy towards the inner volume.

5. The apparatus of claim 1, further comprising a window, disposed in the inner volume, covering the first and second capacitive sensors.

6. An apparatus for processing a substrate, comprising:
a chamber body defining an inner volume;
a non-contact substrate positioning assembly comprising a body having an upper surface and a plurality of ports formed on the upper surface configured to deliver a plurality of fluid flows to position a substrate over the upper surface;
first, second and third capacitive sensors configured to operate in temperatures between about 400° C. and about 1000° C., the first, second and third capacitive sensors disposed on the upper surface of the body of the non-contact substrate positioning assembly, wherein
the first and third capacitive sensors are disposed at two locations along a circle, the two locations are about 90 degrees apart, the second capacitive sensor is disposed in a region inside the circle,
the first and third capacitive sensors are positioned to measure a horizontal planar position of the substrate,
the second capacitive sensor is positioned to measure a vertical position of the substrate; and
the first capacitive sensor is aligned with a first port of the plurality of ports along a first radius extending from a center of the upper surface of the non-contact substrate positioning assembly; and a controller coupled to the first, second, and third capacitive sensors, wherein the controller is configured to determine the vertical position of the substrate from a measurement of the second capacitive sensor, and to determine a distance of an edge of the substrate from a target position by using a measurement of the first capacitive sensor and the vertical position of the substrate.

7. The apparatus of claim 6, wherein the non-contact substrate positioning assembly further comprises a heater embedded therein.

8. The apparatus of claim 6, further comprising a deposition shield covering the first, second, and third capacitive sensors.

9. The apparatus of claim 1, wherein the non-contact substrate positioning assembly further comprises a heater embedded therein.

10. The apparatus of claim 1, wherein the second capacitive sensor is aligned with a second port of the plurality of ports along a second radius extending from the center of the upper surface of the non-contact substrate positioning assembly.

11. The apparatus of claim 10, wherein the third capacitive sensor is aligned with a third port of the plurality of ports along a third radius extending from the center of the upper surface of the non-contact substrate positioning assembly.

12. The apparatus of claim 11, wherein the first capacitive sensor, the first port, the third capacitive sensor, and the third port are aligned along a common line extending through the center of the upper surface of the non-contact substrate positioning assembly.

13. The apparatus of claim 12, further comprising a plurality of thermal sensors positioned at the upper surface and aligned along the common line extending through the center of the upper surface.

14. The apparatus of claim 6, wherein the second capacitive sensor is aligned with a second port of the plurality of ports along a second radius extending from the center of the upper surface of the non-contact substrate positioning assembly.

15. The apparatus of claim 14, wherein the third capacitive sensor is aligned with a third port of the plurality of ports along a third radius extending from the center of the upper surface of the non-contact substrate positioning assembly.

16. The apparatus of claim 15, wherein the first capacitive sensor, the first port, the third capacitive sensor, and the third port are aligned along a common line extending through the center of the upper surface of the non-contact substrate positioning assembly.

17. The apparatus of claim 16, further comprising a plurality of thermal sensors positioned at the upper surface and aligned along the common line extending through the center of the upper surface.

* * * * *